(12) United States Patent
Matsumura et al.

(10) Patent No.: US 6,414,568 B1
(45) Date of Patent: Jul. 2, 2002

(54) INTERDIGITATED, LAMINATED LC BANDPASS FILTER WITH DIFFERENT LENGTH ELECTRODES

(75) Inventors: Sadayuki Matsumura, Takefu; Noboru Kato, Sabae; Miki Sasamura, Fukui-ken, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/575,069

(22) Filed: May 19, 2000

(30) Foreign Application Priority Data

May 20, 1999 (JP) .......................................... 11-140408

(51) Int. Cl.$^7$ ................................................ H03H 7/09
(52) U.S. Cl. ...................................... 333/185; 333/177
(58) Field of Search .................................. 333/177, 184, 333/185

(56) References Cited

U.S. PATENT DOCUMENTS 5,892,415 A * 4/1999 Okamura ..................... 333/185
6,114,925 A * 9/2000 Lo .............................. 333/185

* cited by examiner

Primary Examiner—Justin P. Bettendorf
(74) Attorney, Agent, or Firm—Keating & Bennett, LLP (57) ABSTRACT

A band pass filter includes LC resonators defined by laminated layers and is constructed such that the resonant frequencies of the LC resonators shift in the same direction when laminated layers deviate from each other. In the arrangement of the band pass filter, the inductor pattern of a first LC resonator and the capacitor pattern of a second LC resonator are disposed on a surface of a first ceramic sheet. The inductor pattern and the capacitor pattern extend to the same side of the first ceramic sheet. In addition, the capacitor pattern of the first LC resonator and the inductor pattern of the second LC resonator are disposed on a surface of a second ceramic sheet. The capacitor pattern and the inductor pattern extend to the same surface of the second sheet.

20 Claims, 7 Drawing Sheets

INTERDIGITATED, LAMINATED LC BANDPASS FILTER WITH DIFFERENT LENGTH ELECTRODES

BACKGROUND OF THE INVENTION

1. Field of the Invention

The present invention relates to band pass filters, and more particularly, the present invention relates to band pass filters included in mobile communication devices such as cellular phones, and various electronic apparatuses.

2. Description of the Related Art

Figure 8:
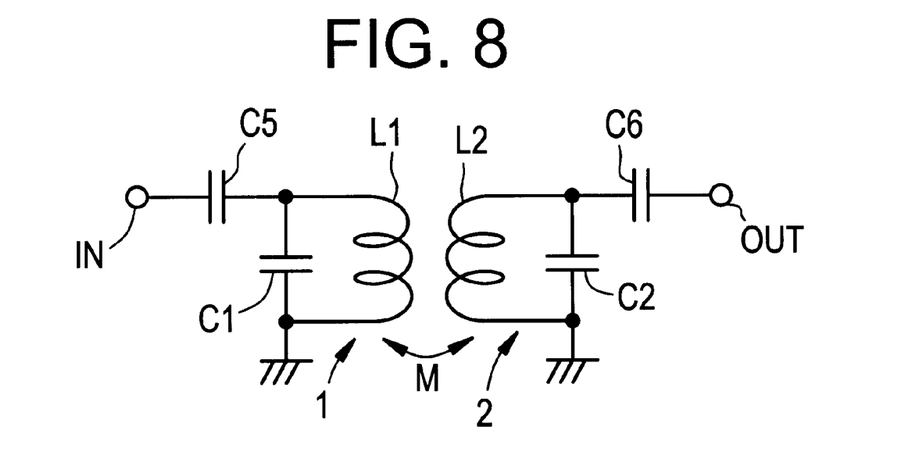
FIG. 8 is an electric equivalent circuit diagram of a conventional band pass filter.

In general, this kind of band pass filter has a plurality of LC resonators, which perform a mutual inductive coupling, which is the so-called "M" coupling, and a capacitive coupling between the LC resonators. FIG. 8 shows an electric equivalent circuit diagram of a two-stage band pass filter having two LC resonators. In this band pass filter, an LC resonator 1 is connected to an input terminal IN via a coupling capacitor C5, and an LC resonator 2 is connected to an output terminal OUT via a coupling capacitor C6. The LC resonator 1 is defined by a parallel circuit including an inductor L1 and a capacitor C1. The LC resonator 2 is defined by a parallel circuit including an inductor L2 and a capacitor C2. The LC resonator 1 and the resonator 2 achieve a mutual inductive coupling between the LC resonators 1, 2.

Figure 9:
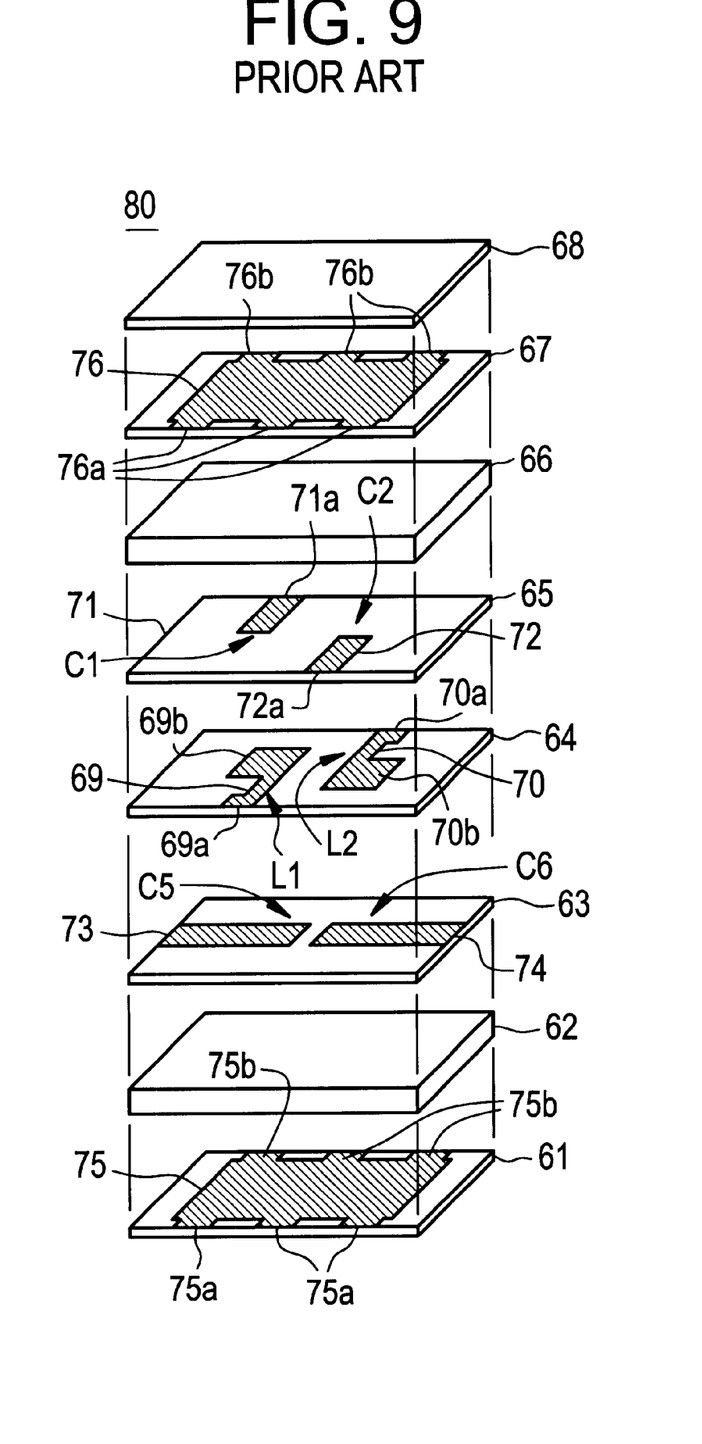
FIG. 9 is an exploded perspective view of the conventional band pass filter.
Figure 10:
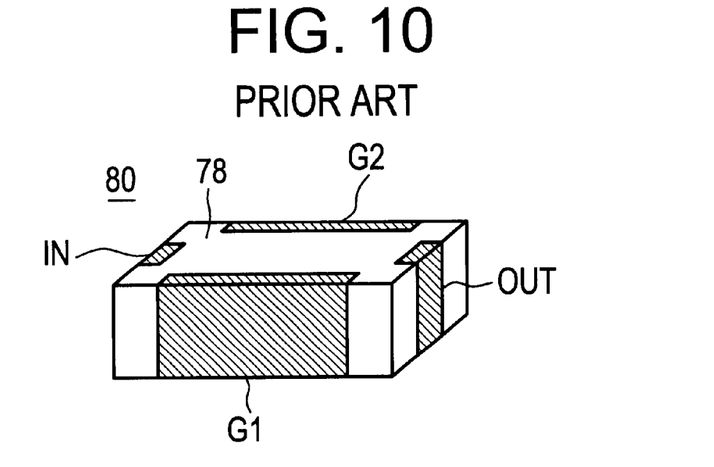
FIG. 10 is a perspective view showing the appearance of the band pass filter shown in FIG. 9.

FIG. 9 shows the detailed structure of a conventional band pass filter 80 having the above equivalent circuit, and FIG. 10 shows an example of the appearance of the conventional band pass filter 80. As shown in FIG. 9, the band pass filter 80 includes a ceramic sheet 63 having an input lead pattern 73 and an output lead pattern 74 disposed on a surface thereof, a ceramic sheet 64 having inductor patterns 69 and 70 disposed on a surface thereof, a ceramic sheet 65 having capacitor patterns 71 and 72 disposed on a surface thereof, a ceramic sheet 61 having a shield electrode 75 disposed on a surface thereof, a ceramic sheet 67 having a shield electrode 76 disposed on a surface thereof.

The inductor L1 is defined by the inductor pattern 69, and the inductor L2 is defined by the inductor pattern 70. The capacitor C1 is defined by the capacitor pattern 71 and an open end 69b of the inductor pattern 69, which opposes the capacitor pattern 71. The capacitor C2 is defined by the capacitor pattern 72 and an open end 70b of the inductor pattern 70, which opposes the capacitor pattern 72. The coupling capacitor C5 is defined by the inductor pattern 69 and the input lead pattern 73. The coupling capacitor C6 is defined by the inductor pattern 70 and the output lead pattern 74.

Lead portions 69a and 70a of the inductor patterns 69 and 70 respectively provided on the surface of the ceramic sheet 64 are exposed at the front and back surfaces of the ceramic sheet 64. In addition, the capacitor patterns 71 and 72 respectively provided on the surface of the ceramic sheet 65 are exposed at the back and front surfaces of the ceramic sheet 65. That is, the inductor pattern 69 of the LC resonator 1 and the inductor pattern 70 of the LC resonator 2 are arranged opposite to each other, and the capacitor pattern 71 of the LC resonator 1 and the capacitor pattern 72 of the LC resonator 2 are arranged opposite to each other. As a result, the LC resonator 1 and the LC resonator 2 perform an interdigital coupling between the LC resonators 1, 2.

As shown in FIG. 10, an input terminal IN, an output terminal OUT, and ground terminals G1 and G2 are provided on a laminated body 78 defined by laminating the ceramic sheets 61 to 68. The input terminal IN is connected to the input lead pattern 73, and the output terminal OUT is connected to the output lead pattern 74. The ground terminal G1 is connected to the lead portion 69a of the inductor pattern 69, the lead portion 72a of the capacitor pattern 72, ends 75a of the shield electrode 75, and ends 76a of the shield electrode 76. The ground terminal G2 is connected to the lead portion 70a of the inductor pattern 70, the lead portion 71a of the capacitor pattern 71, the other ends 75b of the shield electrode 75, and the other ends 76b of the shield electrode 76.

In the conventional band pass filter 80, the inductor patterns 69 and 70 are located on the same ceramic sheet 64, and the capacitor patterns 71 and 72 are located on the same ceramic sheet 65. The inductor patterns 69 and 70 extend to the mutually opposing sides of the ceramic sheet 64, and the lead portions 69a and 70a are exposed at the respective opposite sides. Similarly, the capacitor patterns 71 and 72 also extend to the mutually opposing surfaces of the ceramic sheet 65, and the lead portions 71a and 72a are exposed at the respective opposite sides.

Figure 11:
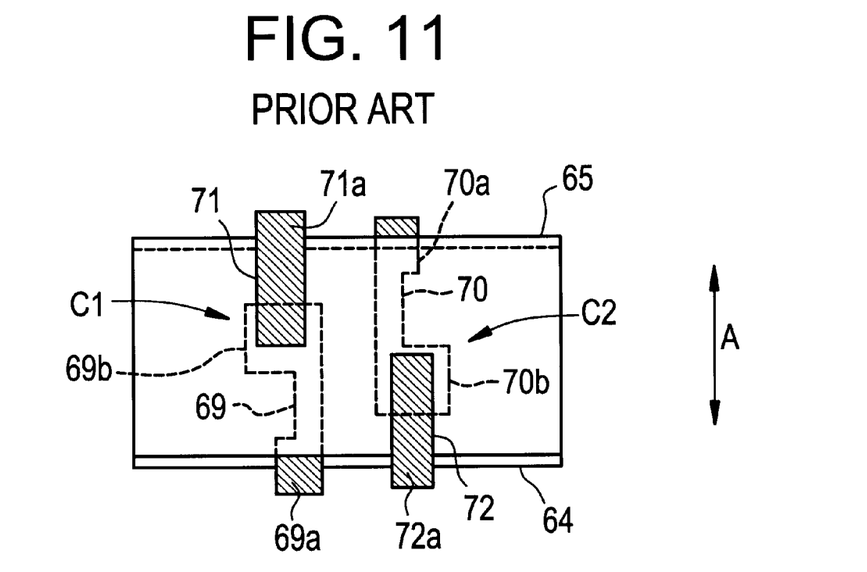
FIG. 11 is an illustration of the pattern arrangement shown when laminated layers deviate from each other.

With this arrangement, for example, as shown in FIG. 11, when the sheets 61 to 68 are laminated, if the sheets 64 deviate from the sheet 65 in a direction A, an area in which the capacitor pattern 71 and the open end 69b of the inductor pattern 69 defining the capacitor C1 face each other decreases, whereas, in contrast, an area in which the capacitor pattern 72 and the open end 70b of the inductor pattern 70 defining the capacitor C2 face each other increases. As a result, since the resonant frequency of the LC resonator 1 shifts in a direction opposite to a direction in which the resonant frequency of the LC resonator 2 shifts, the characteristics of the band pass filter are deteriorated.

SUMMARY OF THE INVENTION

In order to overcome the problems described above, preferred embodiments of the present invention provide a band pass filter in which the resonant frequencies of the LC resonators shift in the same direction when laminated layers deviate from each other.

One preferred embodiment of the present invention provides a band pass filter including a laminated body having a laminated body of a plurality of insulation layers, a plurality of inductor patterns, and a plurality of capacitor patterns; a plurality of inductors provided inside of the laminated body by the plurality of inductor patterns; and a plurality of capacitors provided inside of the laminated body by disposing the capacitor patterns to be opposed to the inductor patterns such that a plurality of LC resonators are formed thereby. In this band pass filter, the capacitor pattern of a first LC resonator of at least one pair of the adjacent LC resonators and the inductor pattern of a second LC resonator of the pair of the LC resonators are disposed on a surface of a first insulation layer, whereas the inductor pattern of the first LC resonator of the pair of the LC resonators and the capacitor pattern of the second LC resonator of the pair of the LC resonators are disposed on a surface of a second insulation layer. On each of the first and second insulation layers, the capacitor pattern and the inductor pattern extend to the same side of the insulation layer so as to be exposed.

With the above arrangement, the inductor patterns of at least one pair of the adjacent LC resonators are arranged in a direction opposite to each other, and the capacitor patterns thereof are also arranged in a direction opposite to each other. As a result, the adjacent LC resonators are interdigitally coupled. In addition, since the capacitor pattern and the inductor pattern on each insulation layer extend to the same side of the insulation layer so as to be exposed, even though the laminated sheets deviate and are located at different positions, the amounts of changes in areas in which the capacitor patterns and the inductor patterns defining each of the capacitors of the adjacent LC resonators face each other are substantially equal. This allows the resonant frequencies of the LC resonators to shift in the same direction, with the result that the characteristics of the band pass filter are stabilized.

Furthermore, at least three insulation layers having the inductor patterns and the capacitor patterns disposed thereon are preferably laminated so as to increase the capacitance of the capacitor in each LC resonator. In addition, at least three LC resonators may define a band pass filter of three or more stages.

Other features, characteristics, arrangements and advantages of the present invention will become more apparent from the detailed description of preferred embodiments of the present invention with reference to the attached drawings.

DETAILED DESCRIPTION OF PREFERRED EMBODIMENTS

Referring to the drawings, descriptions will be provided of band pass filters according to preferred embodiments of the present invention.

Figure 1:
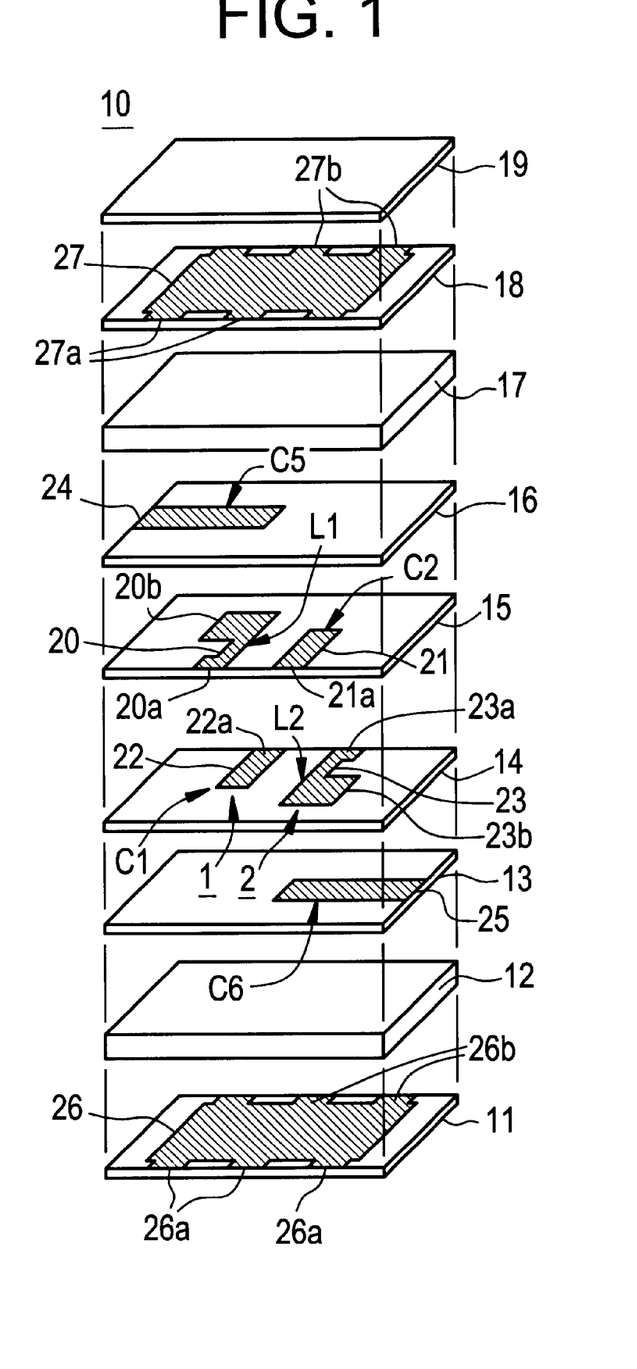
FIG. 1 is an exploded perspective view of a band pass filter according to a first preferred embodiment of the present invention.

FIG. 1 shows a preferred embodiment in which the present invention is applied to a band pass filter having the circuit structure described in FIG. 8. A band pass filter 10 preferably includes a ceramic sheet 16 having an input lead pattern 24 disposed thereon, a ceramic sheet 15 having an inductor pattern 20 and a capacitor pattern 21 disposed thereon, a ceramic sheet 14 having a capacitor pattern 22 and an inductor pattern 23 disposed thereon, a ceramic sheet 13 having an output lead pattern 25 disposed thereon, a ceramic sheet 11 having a shield electrode 26 disposed thereon, and a ceramic sheet 18 having a shield electrode 27 disposed thereon.

The inductor pattern 20 is disposed on the left side of the sheet 15, and a lead portion 20a of the inductor pattern 20 is exposed at the front surface of the sheet 15. The capacitor pattern 21 is disposed on the right side of the sheet 15, and a lead portion 21a of the capacitor pattern 21 is exposed at the front surface of the sheet 15. The capacitor pattern 22 is disposed on the left side of the sheet 14, and a lead portion 22a of the capacitor pattern 22 is exposed at the back surface of the sheet 14. The inductor pattern 23 is disposed on the right side of the sheet 14, and a lead portion 23a of the inductor pattern 23 is exposed at the back surface of the sheet 14.

The inductor L1 of the input-side LC resonator 1 shown in FIG. 8 is defined by the inductor pattern 20. The capacitor C1 is defined by the capacitor pattern 22 and an open end 20b of the inductor pattern 20 opposite to the capacitor pattern 22. The inductor L2 of the output-side LC resonator 2 is defined by the inductor pattern 23. The capacitor C2 is defined by the capacitor pattern 21 and an open end 23b of the inductor pattern 23 opposite to the capacitor pattern 21. The pattern widths of the open end 20b of the inductor pattern 20 and the open end 23b of the inductor pattern 23 are increased so that they can easily function as capacitor patterns. In addition, the inductor patterns 20 and 23 are arranged in opposite directions, and the capacitor patterns 21 and 22 are arranged in opposite directions. As a result, the LC resonator 1 and the LC resonator 2 achieve the so-called interdigital coupling therebetween.

An end of the input lead pattern 24 is exposed at the left surface of the sheet 16. The other end of the input lead pattern 24 faces the inductor pattern 20 to define a coupling capacitor CS. An end of the output lead pattern 25 is exposed at the right surface of the sheet 13, and the other end of the output lead pattern 25 faces the inductor pattern 23 to define a coupling capacitor C6.

Figure 2:
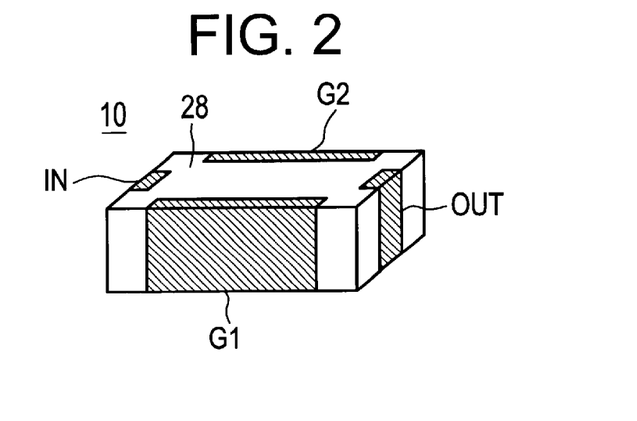
FIG. 2 is a perspective view showing the appearance of the band pass filter shown in FIG. 1.

After the ceramic sheets 11 to 19 are laminated, they are integrally fired to define a laminated body 28, as shown in FIG. 2. On the laminated body 28, an input terminal IN, an output terminal OUT, and ground terminals G1 and G2 are provided. The input terminal IN is connected to the input lead pattern 24, and the output terminal OUT is connected to the output lead pattern 25. The ground terminal G1 is connected to the lead portion 20a of the inductor pattern 20, the lead portion 21a of the capacitor pattern 21, ends 26a of the shield electrode 26, and ends 27a of the shield electrode 27. The ground terminal G2 is connected to the lead portion 23a of the inductor pattern 23, the lead portion 22a of the capacitor pattern 22, the other ends 26b of the shield electrode 26, and the other ends 27b of the shield electrode 27.

Figure 3:
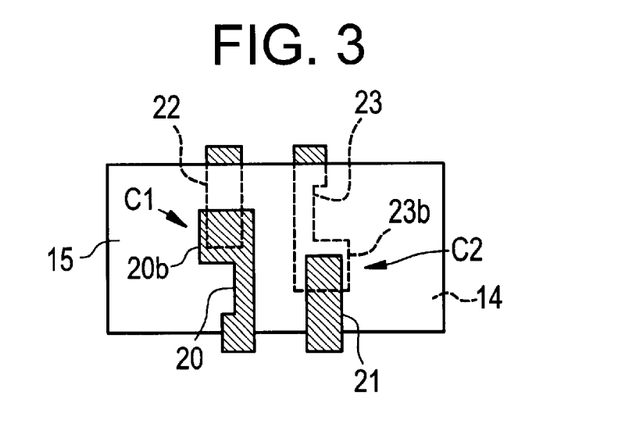
FIG. 3 is an illustration showing the regular pattern arrangement of the band pass filter shown in FIG. 1.

As shown in FIG. 3, in the band pass filter 10, the inductor pattern 20 of the LC resonator 1 and the capacitor pattern 21 of the LC resonator 2 are disposed on a surface of the ceramic sheet 15. The inductor pattern 20 and the capacitor pattern 21 extend to the same surface of the sheet 15. In addition, the capacitor pattern 22 of the LC resonator 1 and the inductor pattern 23 of the LC resonator 2 are disposed on a surface of the ceramic sheet 14. The capacitor pattern 22 and the inductor pattern 23 extend to the same surface of the sheet 14.

Figure 4:
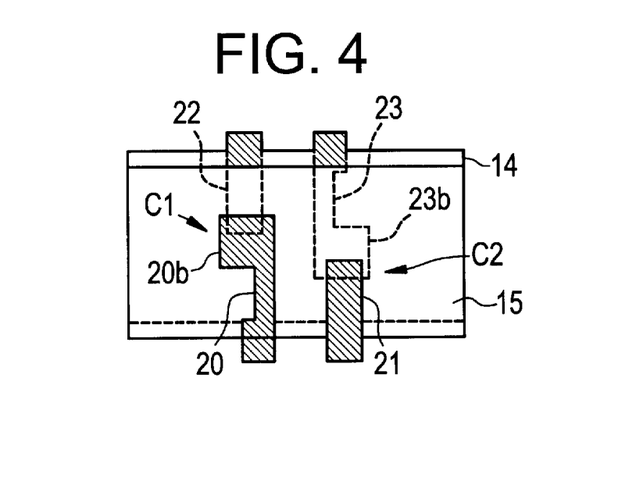
FIG. 4 is an illustration of the pattern arrangement shown when laminated layers deviate from each other.

With this arrangement, as shown in FIG. 4, even though the ceramic sheet 14 deviates from the ceramic sheet 15 in the laminated body, the amount of changes in an area where the capacitor pattern 22 and the inductor pattern 20 defining the capacitor C1 face each other is equal to the amount of changes in an area where the capacitor pattern 21 and the inductor pattern 23 defining the capacitor C2 face each other. As a result, since the resonant frequencies of the LC resonators 1 and 2 shift toward the same direction according to the deviation between the laminated sheets 14 and 15, this permits the filter characteristics of the band pass filter 10 to be stabilized.

Figure 5:
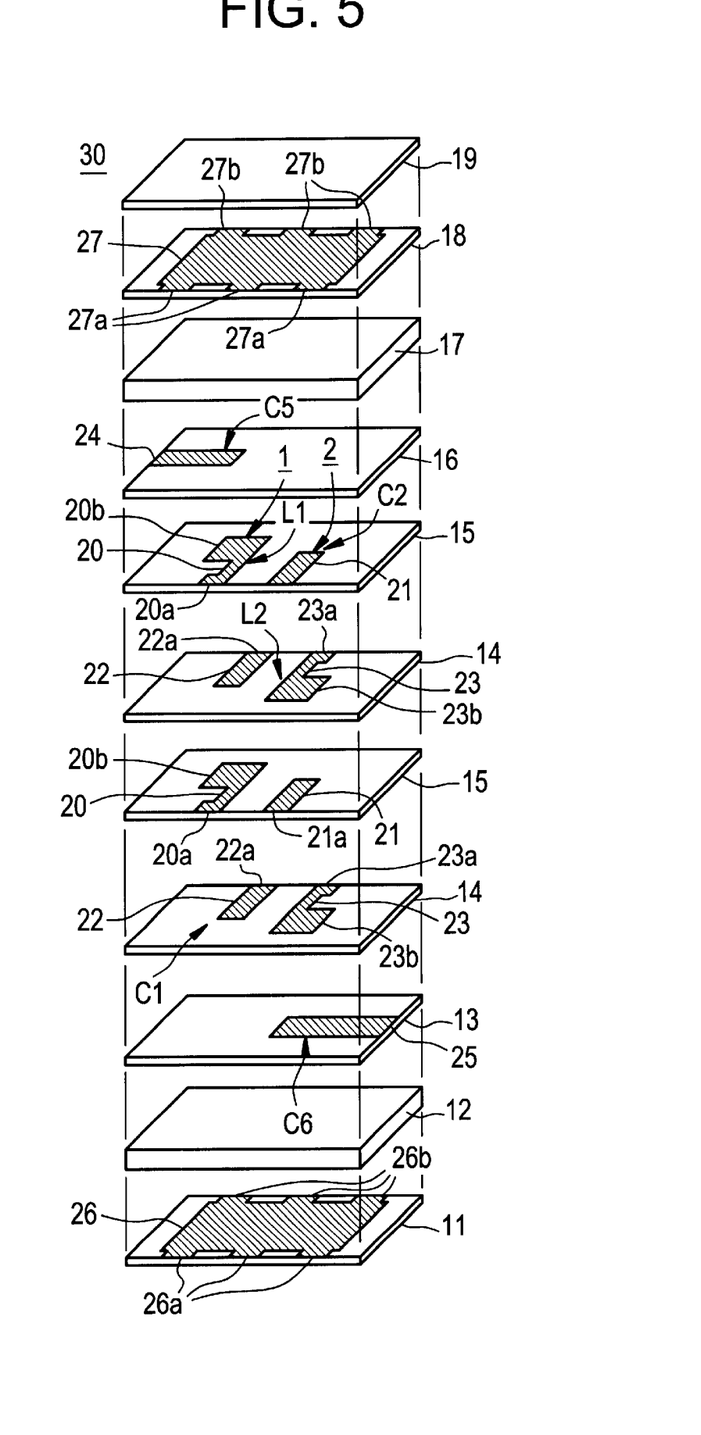
FIG. 5 is an exploded perspective view of the band pass filter according to a second preferred embodiment of the present invention.

FIG. 5 shows a band pass filter according to a second preferred embodiment of the present invention. A band pass filter 30 is provided by laminating two pieces of the ceramic sheets 15 having the inductor patterns 20 and the capacitor patterns 21 disposed thereon and two pieces of the ceramic sheets 14 having the inductor patterns 23 and the capacitor patterns 22 disposed thereon, in the structure of the band pass filter 10 of the first preferred embodiment shown in FIG. 1. With this arrangement, the band pass filter 30 of the second preferred embodiment permits the capacitance of the capacitor C1 of the input-side LC resonator 1 and the capacitance of the capacitor C2 of the output-side LC resonator 2 to be increased, in addition to also achieving the advantages provided by the band pass filter of the first preferred embodiment. In FIG. 5, the same reference numerals are used to indicate the elements corresponding to those shown in FIG. 1, and the explanation thereof is omitted.

Figure 6:
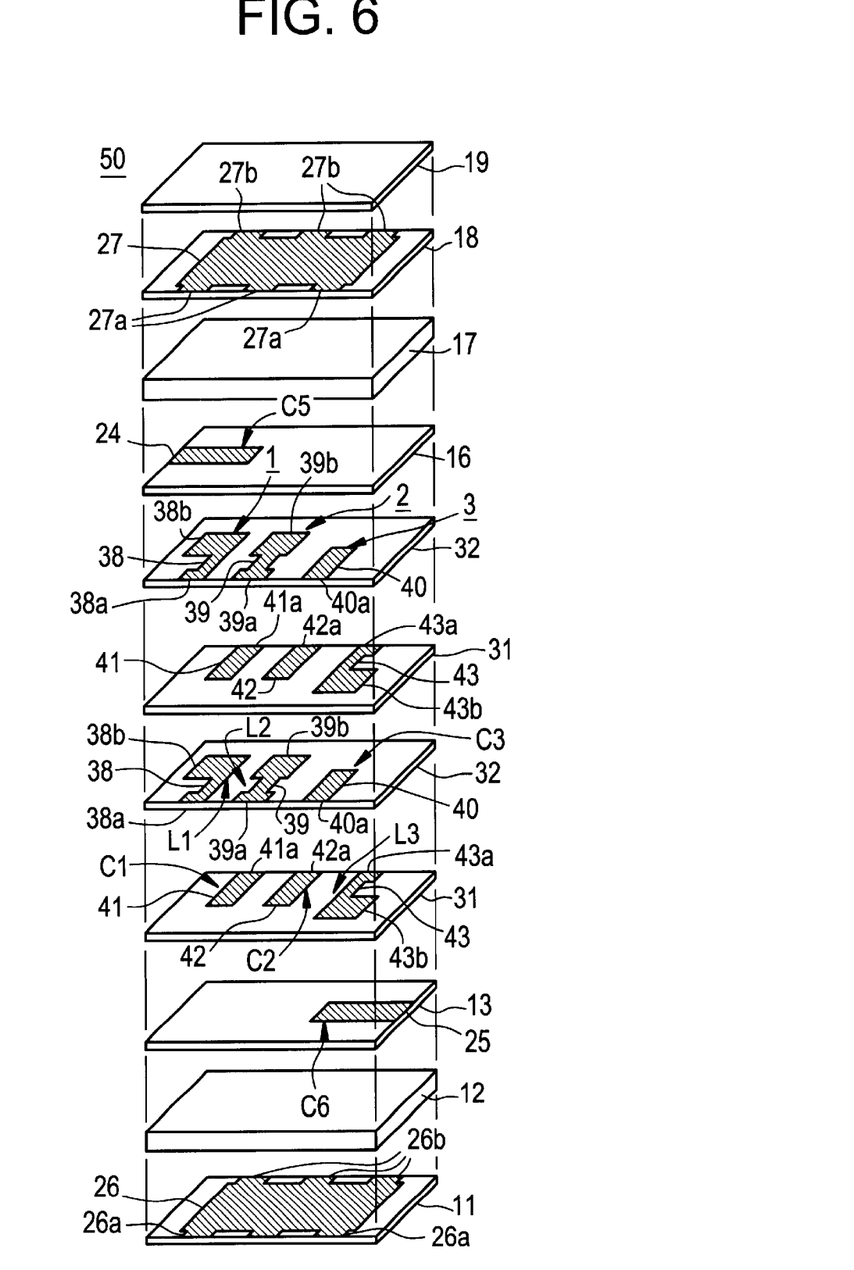
FIG. 6 is an exploded perspective view of the band pass filter according to a third preferred embodiment of the present invention.

FIG. 6 shows a band pass filter according to a third preferred embodiment of the present invention. A band pass filter 50 is defined by applying preferred embodiments of the present invention to a three-stage band pass filter having three LC resonators. In FIG. 6, the same reference numerals are used to indicate elements corresponding to those shown in FIG. 1, and the explanation thereof is omitted.

Inductor patterns 38 and 39 are disposed on the left side of the sheet 32 and the center thereof, respectively. A lead portion 38a of the inductor pattern 38 and a lead portion 39a of the inductor pattern 39 are both exposed at the front surface of the sheet 32. A capacitor pattern 40 is disposed on the right side of the sheet 32, and a lead portion 40a of the capacitor pattern 40 is exposed at the front surface. A capacitor pattern 41 is disposed on the left side of the sheet 31, and a capacitor pattern 42 is disposed at center thereof. A lead portion 41a of the capacitor pattern 41 and a lead portion 42a of the capacitor pattern 42 are both exposed at the back surface of the sheet 31. The inductor pattern 43 is disposed on the right side of the sheet 31, and the lead portion 43a thereof is exposed on the back surface of the sheet 31.

An inductor L1 of the input-side (a first-stage) LC resonator 1 is defined by the inductor pattern 38, and a capacitor C1 is defined by the capacitor pattern 41 and an open end 38b of the inductor pattern 38 opposite to the capacitor pattern 41. An inductor L2 of a second-stage LC resonator 2 is defined by the inductor pattern 39, and a capacitor C2 is defined by the capacitor pattern 42 and an open end 39b of the inductor pattern 39 opposing the capacitor pattern 42. An inductor L3 of the output-side (a third-stage) LC resonator 3 is defined by the inductor pattern 43, and a capacitor C3 is defined by the capacitor pattern 40 and an open end 43b of the inductor pattern 43 opposite to the capacitor pattern 40.

The pattern widths of the open ends 38b, 39b, and 43b of the inductor patterns 38, 39, and 43 are broadened so that they can easily function as capacitor patterns. Furthermore, the inductor patterns 38 and 39 are arranged so as to extend in the same direction, and the capacitor patterns 41 and 42 are arranged so as to extend in the same direction. As a result, the LC resonator 1 and the LC resonator 2 achieve the so-called comb-line coupling therebetween. Meanwhile, the inductor patterns 39 and 43 are arranged so as to extend in mutually opposite directions, and the capacitor patterns 42 and 40 are also arranged so as to extend in mutually opposite directions. As a result, the LC resonator 2 and the LC resonator 3 achieve the so-called interdigital coupling between them.

An input lead pattern 24 faces the inductor pattern 38 to define a coupling capacitor C5. An output lead pattern 25 faces the inductor pattern 43 to define a coupling capacitor C6.

Figure 7:
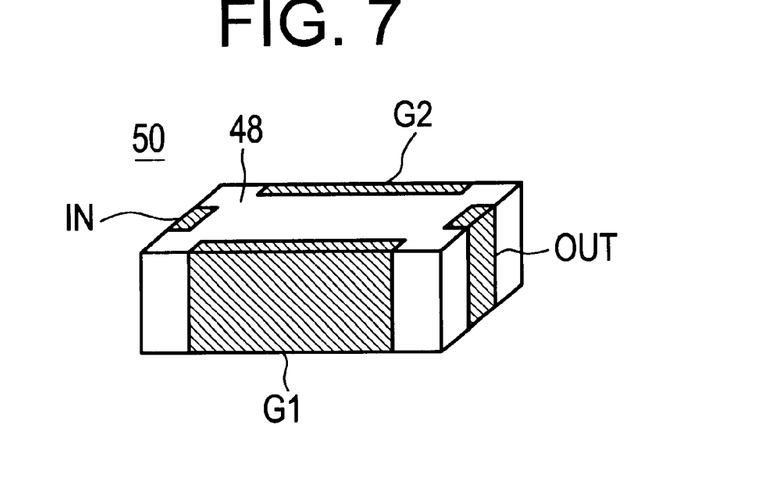
FIG. 7 is a perspective view showing the appearance of the band pass filter shown in FIG. 6.

After ceramic sheets 11 to 13 and 16 to 19 are laminated in addition to the sheets 31 and 32, they are integrally fired to define a laminated body 48, as shown in FIG. 7. On the laminated body 48, an input terminal IN, an output terminal OUT, and ground terminals G1 and G2 are provided. The input terminal IN is connected to the input lead pattern 24, and the output terminal OUT is connected to the output lead pattern 25. The ground terminal G1 is connected to the lead portions 38a and 39a of the inductor patterns 38 and 39, the lead portion 40a of the capacitor pattern 40, ends 26a of the shield electrode 26, and ends 27a of the shield electrode 27. The ground terminal G2 is connected to the lead portion 43a of the inductor pattern 43, the lead portions 41a and 42a of the capacitor patterns 41 and 42, the other ends 26b of the shield electrode 26, and the other ends 27b of the shield electrode 27.

In the band pass filter 50, the inductor patterns 38 and 39 of the LC resonators 1 and 2, and the capacitor pattern 40 of the LC resonator 3 are disposed on a surface of the ceramic sheet 32. The inductor patterns 38 and 39, and the capacitor pattern 40 extend to the same surface of the sheet 32. In addition, the capacitor patterns 41 and 42 of the LC resonators 1 and 2, and the inductor pattern 43 of the LC resonator 3 are disposed on a surface of the ceramic sheet 31. The capacitor patterns 41 and 42, and the inductor pattern 43 extend to the same surface of the sheet 31.

With this arrangement, in the laminated body, even though the ceramic sheet 31 deviates from the ceramic sheet 32, the amount of changes in an area where the capacitor pattern 41 and the inductor pattern 38 defining the capacitor C1 face each other, the amount of changes in an area where the capacitor pattern 42 and the inductor pattern 39 defining the capacitor C2 face each other, and the amount of changes in an area where the capacitor pattern 40 and the inductor pattern 43 defining the capacitor C3 face each other are substantially equal. As a result, since the resonant frequencies of the LC resonators 1 to 3 shifts toward the same direction according to the deviation between the sheets 31 and 32, this permits the filter characteristics of the band pass filter 50 to be stabilized.

The band pass filter in accordance with the present invention is not restricted to those of the above-described preferred embodiments. Various modifications can be made within the scope of the invention. For example, four or any number of LC resonators may be disposed in the band pass filter of the present invention.

Furthermore, in each of the above preferred embodiments, after the insulative sheets having patterns formed thereon are laminated, they are integrally fired. However, this is not the only method that is possible with the present invention. The insulative sheets may be fired in advance. In addition, the band pass filter of the present invention may be formed by a method described as follows. After an insulation layer is formed with a paste insulation material by printing or other methods, a paste conductive pattern material is applied on a surface of the insulation layer to define an arbitrary pattern.

Next, the paste insulation material is again applied on the pattern so as to define an insulation layer containing the pattern therein. Similarly, by applying the paste insulation material in sequence, a band pass filter having a laminated body can be obtained.

As described above, according to preferred embodiments of the present invention, the capacitor patterns and the inductor patterns of at least one pair of adjacent LC resonators are disposed on the surface of the same insulation layer, and the capacitor pattern and the inductor pattern on each insulation layer are extended to the same surface to be exposed. As a result, even though the laminated sheets deviate from each other, the amounts of changes in areas where the capacitor patterns and the inductor patterns defining the capacitors of the LC resonators face each other are substantially equal. With the arrangement, the resonant frequencies of the LC resonators deviate in the same direction, with the result that a band pass filter having stable characteristics can be obtained.

While the invention has been particularly shown and described with reference to preferred embodiments thereof, it will be understood by those skilled in the art that the forgoing and other changes in form and details may be made therein without departing from the scope of the invention.

What is claimed is:

1. A band pass filter comprising:
    a laminated body including a plurality of insulation layers, a plurality of inductor patterns, and a plurality of capacitor patterns,
    a plurality of inductors provided inside of the laminated body and including the inductor patterns; and
    a plurality of capacitors provided inside of the laminated body by the capacitor patterns and arranged opposite to the inductor patterns so that a plurality of LC resonators are defined;
    wherein the capacitor pattern of a first LC resonator of at least one pair of adjacent LC resonators and the inductor pattern of a second LC resonator of the at least one pair of the LC resonators are disposed on a surface of a first Insulation layer, the inductor pattern of the first LC resonator of the at least one pair of the LC resonators and the capacitor pattern of the second LC resonator thereof are disposed on a surface of a second insulation layer, and the capacitor pattern and the inductor pattern disposed on each of the first and second insulation layers extend to the same side of respective ones of the first and second insulation layers so as to be exposed; and
    a length of the capacitor pattern of the first LC resonator is different from a length of the inductor of the second LC resonator disposed on the surface of the first insulation layer, and a length of the capacitor pattern of the second LC resonator is different from a length of inductor pattern of the first LC resonator disposed on the second insulation layer.

2. A band pass filter according to claim 1, wherein the laminated body includes at least three insulation layers having the inductor patterns and the capacitor patterns disposed thereon.

3. A band pass filter according to claim 1, wherein at least three of the LC resonators define a filter having at least three stages.

4. A band pass filter according to claim 1, further comprising shield electrodes provided on the insulation layers.

5. A band pass filter according to claim 1, wherein at least one of the inductor patterns is disposed on the left side of one of the insulation layers and at least one of the capacitor patterns is disposed on the right side of the one of the insulation layers.

6. A band pass filter according to claim 5, wherein a lead portion of the at least one of the capacitor patterns is exposed at a front side of the one of the insulation layers.

7. A band pass filter according to claim 5, wherein a lead portion of the at least one of the capacitor patterns is exposed at a rear side of the one of the insulation layers.

8. A band pass filter according to claim 1, wherein the inductor patterns include open ends and pattern widths of the open ends of the inductor patterns are arranged to define capacitor patterns.

9. A band pass filter according to claim 1, wherein at least two of the inductor patterns are arranged to extend in opposite directions.

10. A band pass filter according to claim 1, wherein at least two of the capacitor patterns are arranged to extend in opposite directions.

11. A band pass filter according to claim 1, wherein at least two of the LC resonators are arranged to be interdigitally coupled to each other.

12. A band pass filter according to claim 1, further comprising input lead patterns arranged to be exposed at one surface and to define coupling capacitors with the inductor patterns.

13. A band pass filter comprising:
    a laminated body including a plurality of insulation layers, a plurality of inductor patterns, and a plurality of capacitor patterns;
    a plurality of inductors provided inside of the laminated body and including the inductor patterns; and
    a plurality of capacitors provided inside of the laminated body by the capacitor patterns and arranged opposite to the inductor patterns so that a plurality of LC resonators are defined;
    wherein at least two of the insulation layers have one of the capacitor patterns and one of the inductor patterns thereon so as to define a pair of adjacent LC resonators such that the capacitor pattern and the inductor pattern on each of the at least two of the insulation layers define different ones of the pair of adjacent LC resonators; and
    a length of the capacitor pattern is different from a length of the inductor pattern on each of the at least two insulation layers.

14. A band pass filter according to claim 13, wherein the laminated body includes at least three insulation layers having the inductor patterns and the capacitor patterns disposed thereon.

15. A band pass filter according to claim 13, wherein at least three of the LC resonators define a filter having at least three stages.

16. A band pass filter according to claim 13, further comprising shield electrodes provided on the insulation layers.

17. A band pass filter according to claim 13, wherein the inductor patterns include open ends and pattern widths of the open ends of the inductor patterns are arranged to define capacitor patterns.

18. A band pass filter according to claim 13, wherein at least two of the inductor patterns are arranged to extend in opposite directions.

19. A band pass filter according to claim 13, wherein at least two of the capacitor patterns are arranged to extend in opposite directions.

20. A band pass filter according to claim 13, wherein at least two of the LC resonators are arranged to be interdigitally coupled to each other.

* * * * *